United States Patent
Cabral, Jr. et al.

(10) Patent No.: US 8,101,518 B2
(45) Date of Patent: *Jan. 24, 2012

(54) METHOD AND PROCESS FOR FORMING A SELF-ALIGNED SILICIDE CONTACT

(75) Inventors: Cyril Cabral, Jr., Mahopac, NY (US); Michael A. Cobb, Croton on Hudson, NY (US); Asa Frye, LaGrangeville, NY (US); Balasubramanian S. Pranatharthi Haran, Yorktown Heights, NY (US); Randolph F. Knarr, Goldens Bridge, NY (US); Mahadevaiyer Krishnan, Hopewell Junction, NY (US); Christian Lavoie, Ossining, NY (US); Andrew P. Mansson, Gilbert, AZ (US); Renee T. Mo, Briarcliff Manor, NY (US); Jay W. Strane, Wappingers Falls, NY (US); Horatio S. Wildman, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 614 days.

This patent is subject to a terminal disclaimer.

(21) Appl. No.: 12/136,885

(22) Filed: Jun. 11, 2008

(65) Prior Publication Data
US 2008/0274611 A1    Nov. 6, 2008

Related U.S. Application Data

(63) Continuation of application No. 10/935,497, filed on Sep. 7, 2004, now Pat. No. 7,544,610.

(51) Int. Cl.
*H01L 21/44* (2006.01)
(52) U.S. Cl. .. 438/653; 438/663; 438/664; 257/E21.476
(58) Field of Classification Search ................ 438/653, 438/664, 663, 597, 233; 257/E21.476
See application file for complete search history.

(56) References Cited

U.S. PATENT DOCUMENTS

| | | | |
|---|---|---|---|
| 6,054,385 A * | 4/2000 | Gardner et al. | 438/655 |
| 6,432,836 B1 | 8/2002 | Watanabe | |
| 6,468,901 B1 | 10/2002 | Maa et al. | |
| 6,905,560 B2 | 6/2005 | Cabral, Jr. et al. | |
| 7,544,610 B2 * | 6/2009 | Cabral et al. | 438/663 |
| 2002/0098689 A1 | 7/2002 | Chong et al. | |
| 2004/0123922 A1 | 7/2004 | Cabral, Jr. et al. | |

OTHER PUBLICATIONS

Yew et al., "Epitaxial growth on NiSi on (111) Si inside 0.1-0.6 mm oxide openings prepared by electron beam lighography", Appl. Phys. Lett., 1996, 999-1001, 69(7). Julies et al., "A study of the NiSi to NiSi2 transition in the Ni-Si binary system", Thin Solid Films, 1999, 201-207, 347.
Poon et al., "Thermal stability of cobalt and nickel silicides", Microelectronics Reliability, 1998, 1495-1498, 38.
Lee, P.S., "New Salicidation Technology With Ni(Pt) Alloy for MOSFETs", IEEE Electron Device Letters, 2001, 568-570, 22(12).

* cited by examiner

*Primary Examiner* — Thinh T Nguyen
(74) *Attorney, Agent, or Firm* — Scully, Scott, Murphy & Presser, P.C.; Louis J. Percello, Esq.

(57) ABSTRACT

The present invention provides a method for forming a self-aligned Ni alloy silicide contact. The method of the present invention begins by first depositing a conductive Ni alloy with Pt and optionally at least one of the following metals Pd, Rh, Ti, V, Cr, Zr, Nb, Mo, Hf, Ta, W or Re over an entire semiconductor structure which includes at least one gate stack region. An oxygen diffusion barrier comprising, for example, Ti, TiN or W is deposited over the structure to prevent oxidation of the metals. An annealing step is then employed to cause formation of a NiSi, PtSi contact in regions in which the metals are in contact with silicon. The metal that is in direct contact with insulating material such as $SiO_2$ and $Si_3N_4$ is not converted into a metal alloy silicide contact during the annealing step A. selective etching step is then performed to remove unreacted metal from the sidewalls of the spacers and trench isolation regions.

27 Claims, 7 Drawing Sheets

METHOD AND PROCESS FOR FORMING A SELF-ALIGNED SILICIDE CONTACT

RELATED APPLICATION

The present application is a continuation application of parent application Ser. No. 10/935,497, filed on Sep. 7, 2004.

FIELD OF THE INVENTION

The present invention relates to semiconductor device manufacturing, and more particularly to a method of fabricating self-aligned metal silicide contacts. The present invention is also related to complementary metal oxide semiconductor (CMOS) structures which include the self-aligned silicide contacts.

BACKGROUND OF THE INVENTION

In the semiconductor industry, metal silicides have typically been used to provide low resistive contacts to source/drain regions and gate electrodes in metal oxide semiconductor (MOS) and CMOS transistors. Titanium silicide ($TiSi_2$) has traditionally been used because of its low resistivity. However, by using the conventional Ti-salicide process the sheet resistance increases for lines having a thickness of less than about 0.35 microns ($\mu m$). A high temperature anneal is needed to completely transform the silicide from the high-resistivity C49 phase to the low-resistivity C54 phase. In some lines, the transformation is not complete and the film agglomerates before complete transformation into the low-resistivity state.

$TiSi_2$ has been replaced with $CoSi_2$ to circumvent the problem mentioned above. However, $CoSi_2$ consumes significant amounts of silicon during formation, which increases the difficulty of forming shallow junctions for silicon-on-insulator (SOI) substrates. Further, as the semiconductor industry approaches dimensions less than 65 nm, $CoSi_2$ also exhibits rapid sheet resistance degradation. Specifically, the polysilicon gate sheet resistance $R_s$ increases sharply at narrow line widths due to voids formed by vacancy coalescence at the polySi grain boundary.

Ni suicide with low resistivity, low salicidation temperature, small mechanical stress, low silicon consumption and relative insensitivity of sheet resistance to linewidth is currently being investigated to replace $CoSi_2$. Manufacturing a functioning device requires several processing steps after contact formation where the silicide temperature typically exceeds 600° C. Under such conditions, NiSi has been reported to agglomerate and form $NiSi_2$ which has a higher resistivity than NiSi. See, for example, J. Y. Yew, et al. "Epitaxial growth of NiSi on (111) Si inside 0.1-0.6 mm oxide openings prepared by electron beam lithography", Appl. Phys. Lett. 69(7), (1996); B. A. Julies, "A Study of the NiSi to $NiSi_2$ Transition in the Ni—Si Binary System", Thin Solid Films, 347, 201, 1999; and M. C. Poon, "Thermal Stability of Cobalt and Nickel Silicides", Microelectronics Reliability 38, 1495, 1998.

Further, when shallow junctions (on the order of about 15 nm or less) are to be formed, nickel disilicide formation is seen under the spacer resulting in shorting of the device between the gate and the source/drain regions. The thermal stability of NiSi has to be improved before it can be used as a contact in submicron microelectronic devices.

Co-pending and co-assigned U.S. patent application Ser. No. 10/334,464, filed Dec. 31, 2002, now U.S. Pat. No. 6,905,560 entitled "Retarding Agglomeration of Ni Monosilicide Using Ni Alloys" describes various metals that can be co-deposited with Ni to prevent disilicide formation. Some of these metals, such as Ti, V, Cr, Zr, Nb, Mo, Hf, Ta, W and Re, prevent nucleation of $NiSi_2$. Ge, Rh, Pd, Pt or mixtures thereof can be used as stabilizing agents.

The successful formation of a silicide contact through the salicide process requires deposition of a thin (less than 10 nm) Ni alloy uniformly over the substrate, heating the substrate to form the silicide over regions where silicon is present and finally selectively etching the unreacted metal without attacking the silicide. Any attack of the silicide would reduce the thickness of the line and increase the contact resistance. Further, the etchant should be capable of not only removing Ni, but all the other metals added along with it. Present etchants for removing Ni and Ni alloys in the salicide contact process are based on a mixture of hydrogen peroxide and sulfuric acid at temperatures greater than 60° C. This is disclosed for example, in U.S. Pat. No. 6,468,901 and P. S. Lee, et al. "New Salicidation Technology with Ni(Pt) Alloy for MOSFETs", IEEE Electronic Device Letters, 22 (12) 2001. Such etchants are incapable of removing all additional elements especially noble metals such as Pt, Pd, Rh and Re used along with Ni. Presence of the unreacted metal on the spacers and trench isolation regions leads to shorting of the devices thereby preventing the manufacturing of a functioning semiconductor chip. The remaining unreacted metal is referred in the art as stringers.

In view of the above, there is a need for providing a new and improved method for forming NiSi contacts which avoids leaving unreacted metals, i.e., stringers, on the spacers and trench isolation regions.

SUMMARY OF THE INVENTION

The present invention provides a method for forming a self-aligned Ni alloy silicide contact. Specifically, the present invention provides a method of forming a self-aligned NiSi, PtSi contact. The method of the present invention begins by first depositing a conductive Ni alloy with Pt and optionally at least one of the following metals Pd, Rh, Ti, V, Cr, Zr, Nb, Mo, Hf, Ta, W or Re over an entire semiconductor structure which includes at least one gate stack region. An oxygen diffusion barrier comprising, for example, Ti, TiN or W, is deposited over the structure to prevent oxidation of the metals. An annealing step is then employed to cause formation of a NiSi, PtSi contact in regions in which the metal alloy is in contact with silicon. The metal that is in direct contact with insulating material, such as $SiO_2$ and $Si_3N_4$, is not converted into a metal alloy silicide contact during the annealing step. A selective etching step is then performed to remove unreacted metal from the sidewalls of the spacers and trench isolation regions. It is important in the present invention that the etch process removes all the unreacted metal, while not attacking the NiSi, PtSi contact that was previously formed.

Current etchants for removing Ni and Ni alloys are based on a mixture of hydrogen peroxide and sulfuric acid. In wet etching, the etched surface is thus oxidized and subsequently dissolved in solution. During oxidation, an electron is removed from the etched surface, in this case the Ni alloy. For example, Ni gets converted to $Ni^{2+}$ after oxidation and this reaction product is soluble in the etchant solution containing sulfuric acid. However, noble metals such as Pt are insoluble in sulfuric acid and hence cannot be removed by this etchant.

To accomplish complete removal of all metals, it is essential that a combination of chemical components is used. One component will oxidize the metal and form an intermediate. The other component will then act on the intermediate and dissolve it in solution. Hence, the etchant solution should be capable of oxidizing and dissolving all unreacted metals and should not be aggressive enough to attack the metal silicide. To prevent attack on the contacts, the metal silicide contacts should be converted from a metal rich phase to the monosilicide completely. In the present invention, a method for forming a NiSi, PtSi contact is provided in which the annealing conditions have been optimized to form such contacts. Removal of the unreacted Ni and Pt on the spacers and trench isolation regions is performed in the present invention by etching the NiPt alloy selective to the NiSi, PtSi contact with a bath containing an oxidizing agent such as nitric acid, a complexing agent such as chloride ion and a solvent such as water. Alternatively, the oxidizing agent can be one of hydrogen peroxide, potassium permanganate, persulfate (sodium, ammonium or potassium), ceric ammonium nitrate or potassium monopersulfate, and complexing agents include, but are not limited to: acids and sodium, potassium and calcium salts of anions such as chloride, bromide and iodide. In one embodiment of the present invention, the The temperature of the etching bath is a factor since the etching process is thermally activated and follows an Arrhenius type dependence on temperature. However, any increase in temperature leads to more decomposition of etchants thereby reducing the life of the bath. Further, at high temperatures there is a possibility of the silicide contacts being attacked by the more aggressive etchant. In the present invention, the bath temperature is held at a constant temperature from about 30° C. to about 80° C., preferably about 40° C. A water bath is typically used to hold the etch tank temperature constant. The etch solution is typically recirculated to remove all reaction products from the surface of the substrate and to prevent formation of a stagnant film of etch product. Bath conditions have been optimized in the present invention to achieve optimal removal of all unreacted material without attack of the silicides.

In broad terms, the method of the present invention, which forms the NiSi, PtSi contact, comprises the steps of:

depositing a blanket layer of Ni with Pt on a surface of a structure including at least one gate region, wherein said Ni is present in a concentration from about 80 to about 95 atomic percent;

forming an oxygen diffusion barrier layer on a surface of the blanket layer; and heating the structure including the blanket layer to a temperature from about 300° C. to about 550° C. by raising the temperature from an ambient temperature at a ramp rate from about 1° C./sec to about 35° C./sec, holding the temperature for about 1 to about 60 seconds in an inert atmosphere containing less than about 1 ppm oxygen, and lowering the temperature below 100° C. within a time period from about 10 to about 600 seconds thereby forming a NiSi, PtSi contact on portions of the structure comprising silicon.

In some embodiments, a second heating step can follow the initial heating step described above. When such an embodiment is employed, the second heating step is performed to a temperature of about 300° C. to about 550° C., with a temperature of about 400° C. to about 475° C. being more preferred.

In addition to the above method, the present invention also relates to a method of etching a NiPt alloy selective to NiSi, PtSi comprising the steps of:

providing a bath comprising an oxidizing agent, a complexing agent and a solvent;

holding the bath at a temperature in a range from about 30° C. to about 80° C. for at least 15 minutes;

contacting a workpiece comprising at least NiPt and NiSi, PtSi with said bath;

holding said bath at a temperature in a range from about 30° C. to about 80° C. for about 10 to about 45 minutes;

removing said workpiece from said bath; and rinsing said workpiece to remove traces of said bath from said workpiece and drying the same.

Additionally, the present invention also provides a semiconductor structure which comprises NiSi, PtSi contacts to a field effect transistor, wherein said structure is free of stringers of Pt.

BRIEF DESCRIPTION OF THE INVENTION

Figure 3:
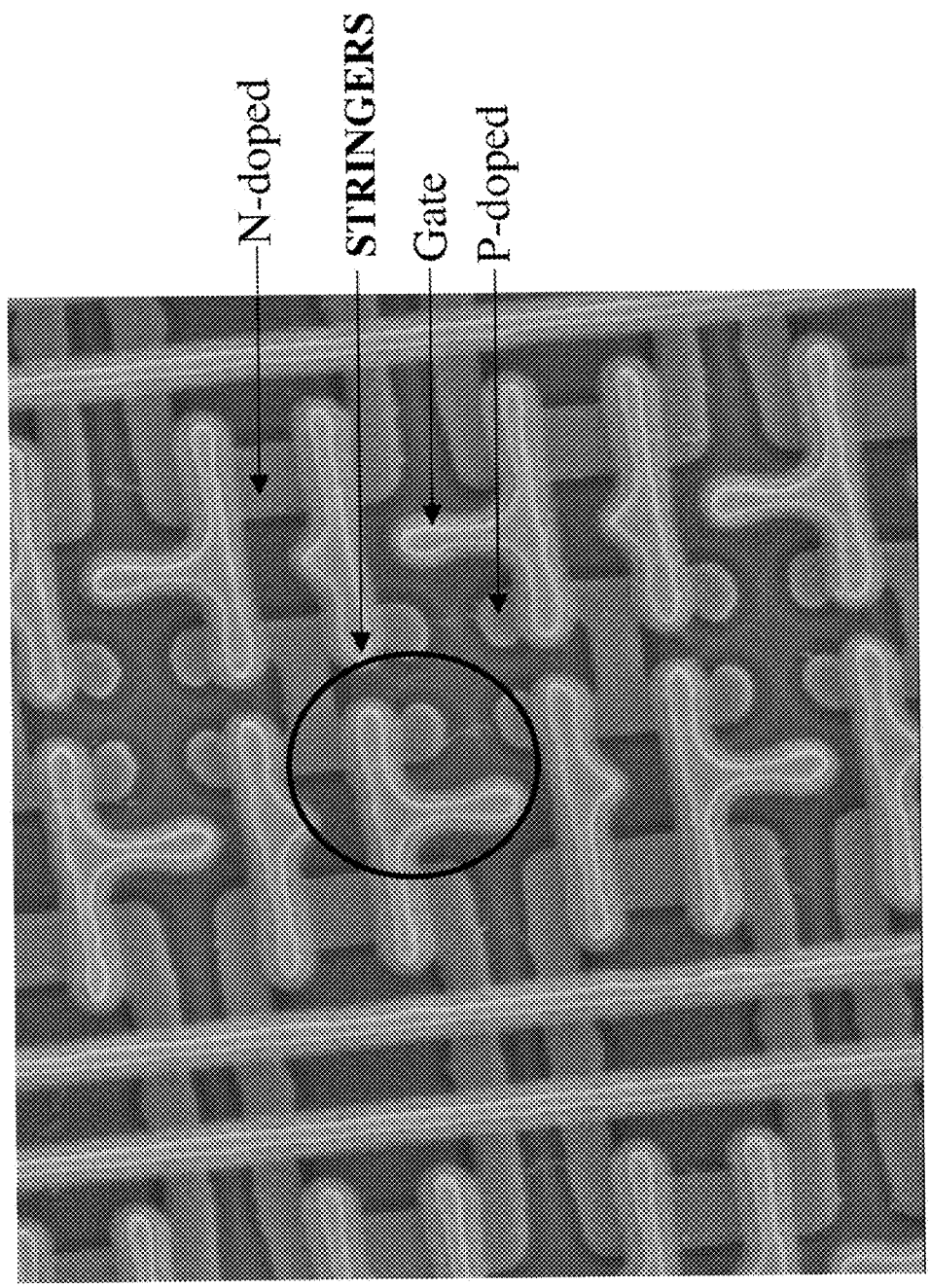

FIG. 3 is a top-down SEM image of a prior art SRAM cell with Ni—Pt silicide contacts. Incomplete removal of metals is seen with a conventional etch solution (hydrogen peroxide, sulfuric acid mixture). AES analysis of stringers reveals that they are comprised of Pt.

Figure 4:
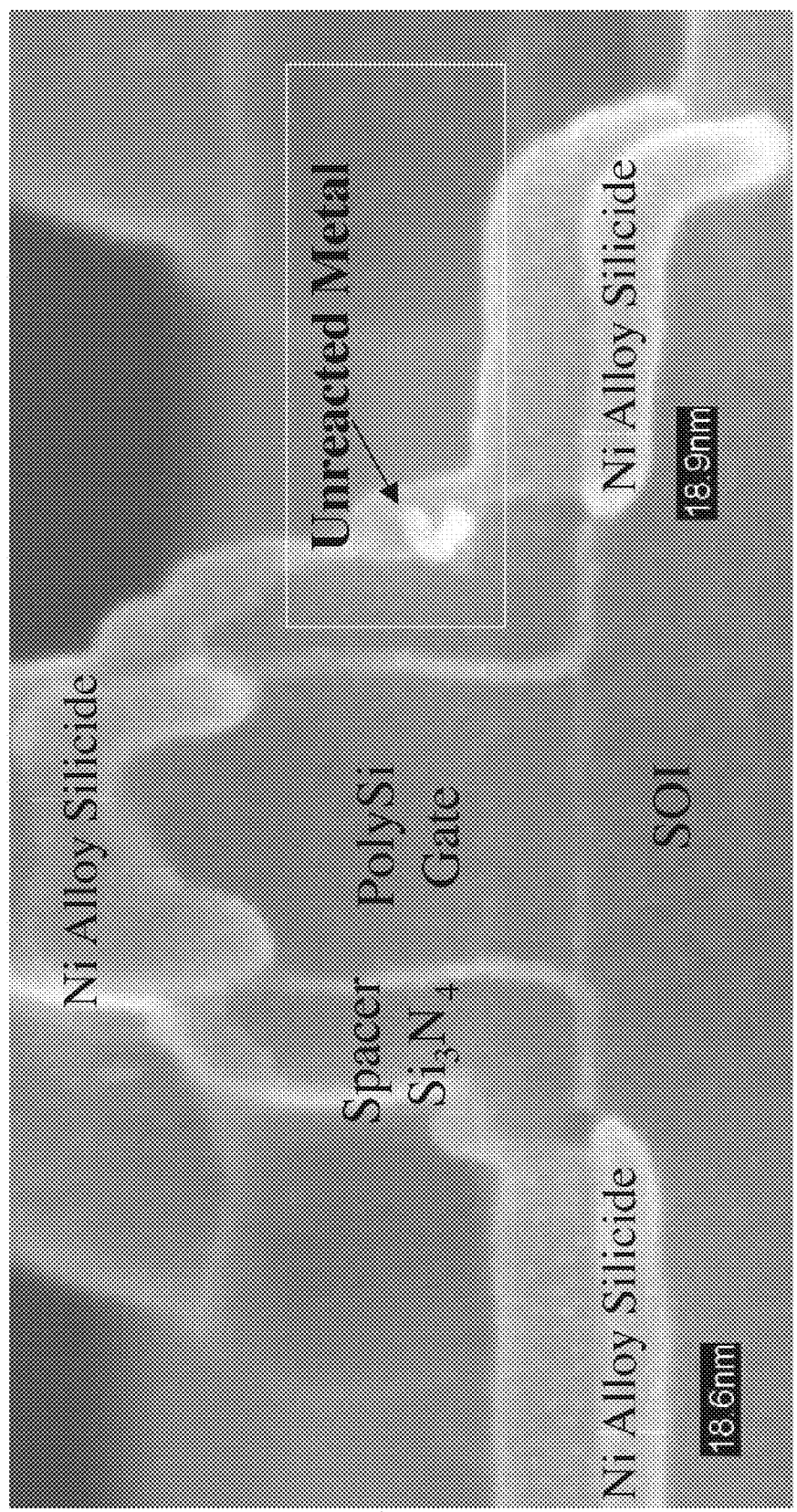

FIG. 4 is a cross-section image of an NFET with Ni—Pt silicide contact. Presence of unreacted metal on the spacer is seen after a conventional etch (Hydrogen peroxide, sulfuric acid mixture).

Figure 5:
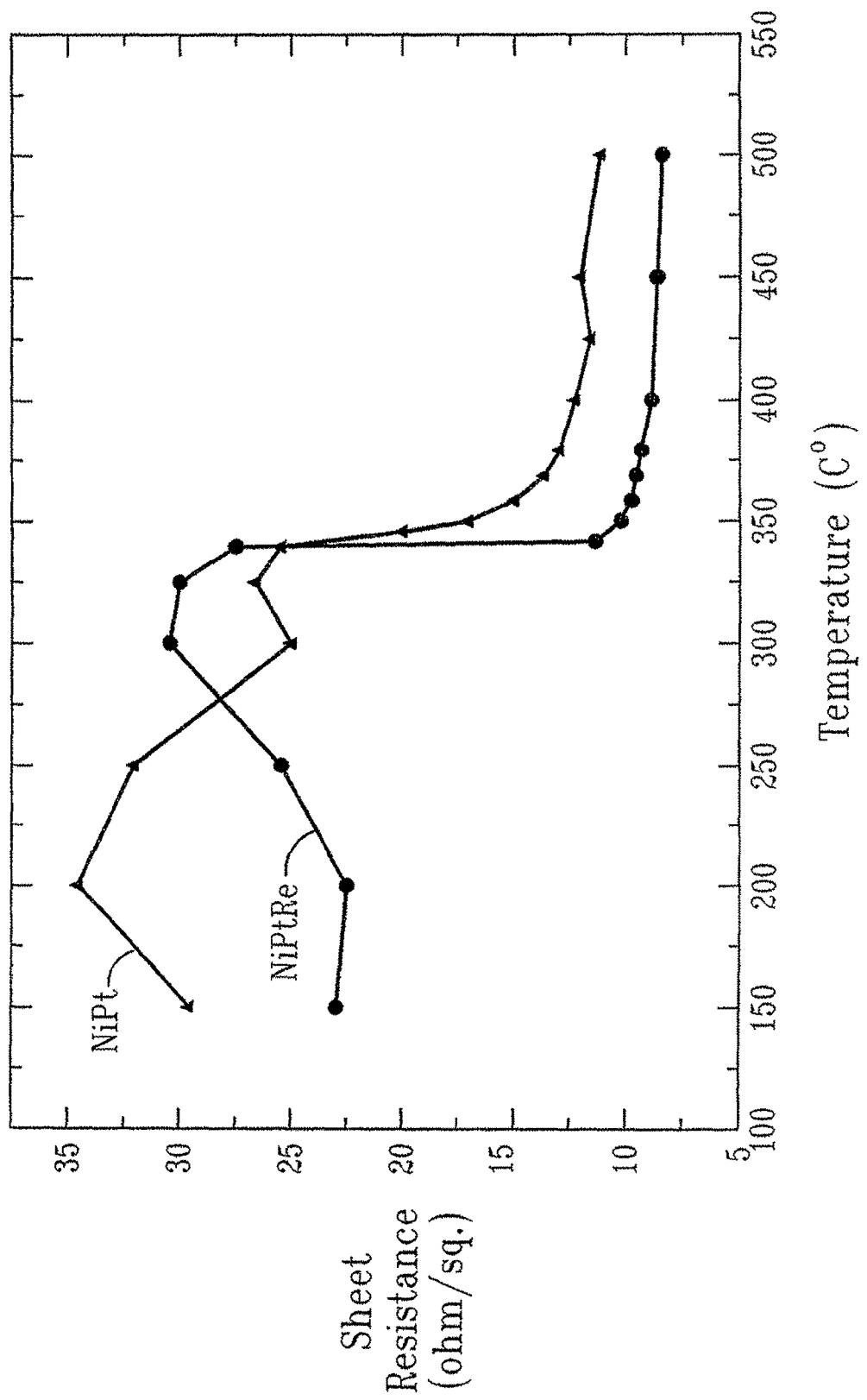

FIG. 5 is a plot showing the change in sheet resistance of Ni alloy samples at various anneal temperatures.

Figure 6:
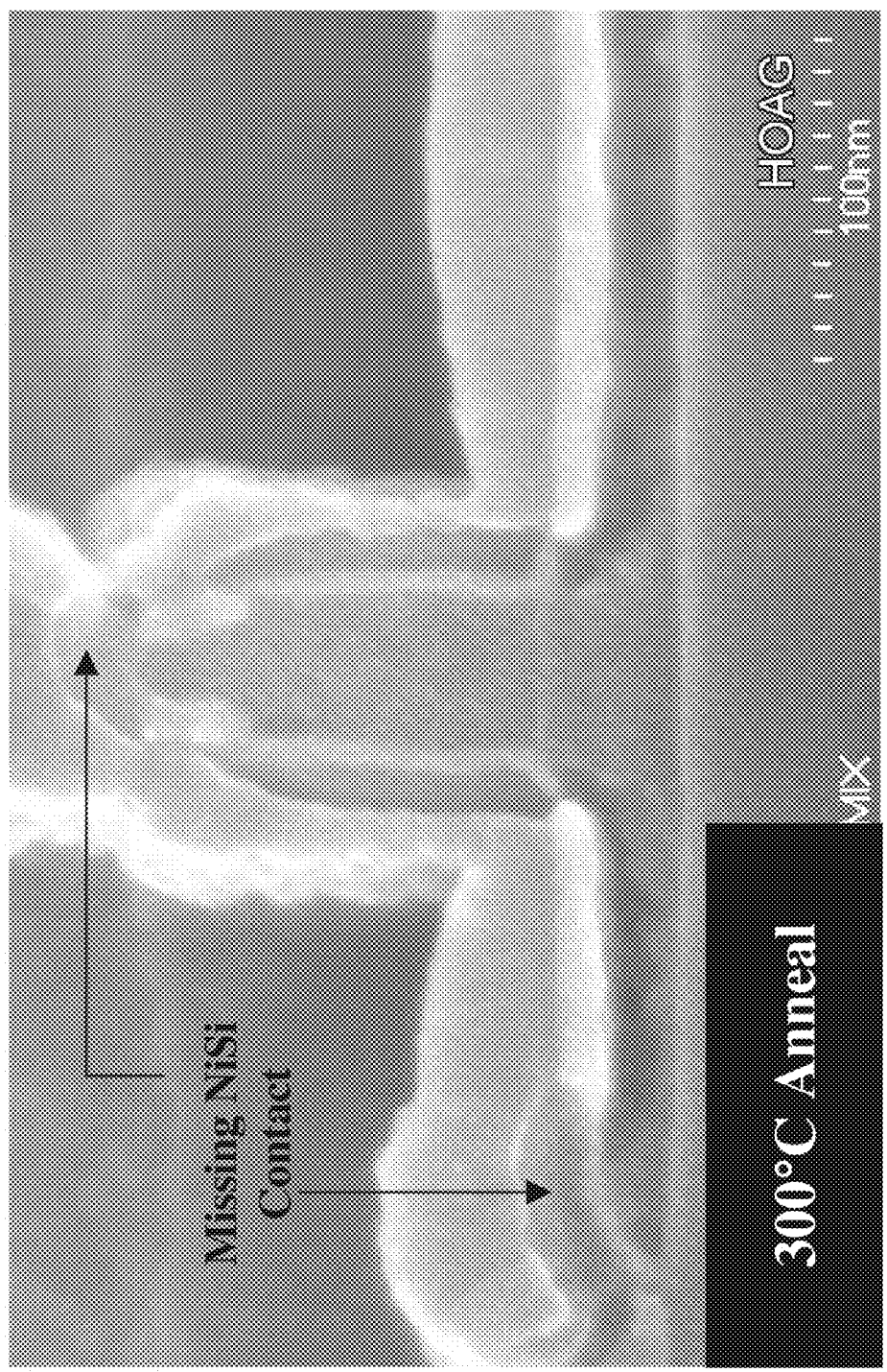

FIG. 6 is a cross-section of a NFET with Ni alloy silicide contacts. The wafer was annealed at 300° C. and subsequently etched. Incomplete silicide formation leads to attack and removal of metal rich phase.

DETAILED DESCRIPTION OF THE INVENTION

The present invention which provides a method of forming self-aligned NiSi, PtSi contacts (i.e., NiPt silicides) without stringers of Pt on insulating regions, will now be described in greater detail by referring to the drawings that accompany the present application. It is noted that the drawings of the present application are provided for illustrative purposes and thus they are not drawn to scale.

Figure 1A:
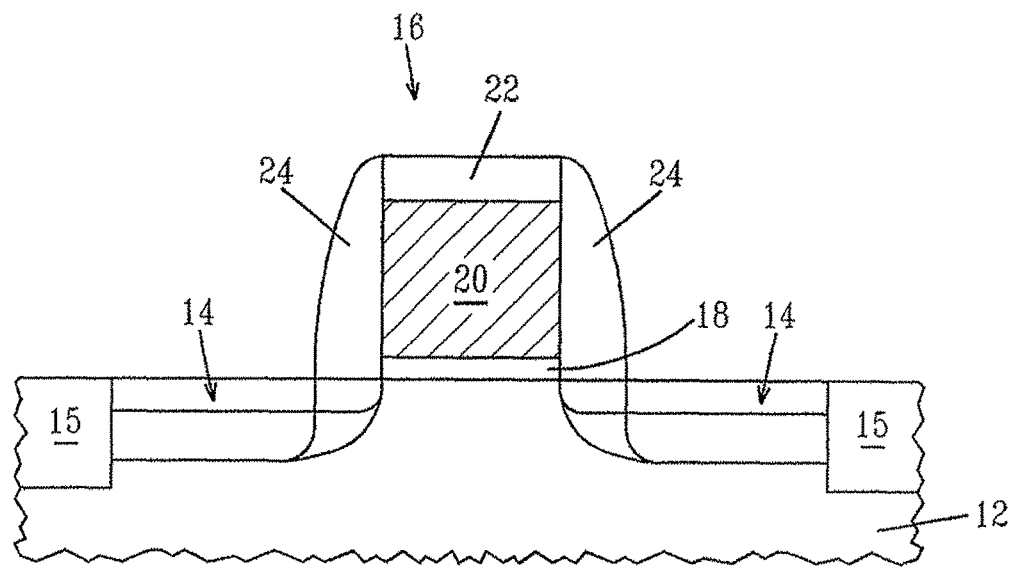
FIGS. 1A-1E are pictorial representations (through cross sectional views) depicting the basic processing steps of the present invention.

Reference is first made to structure 10 that is illustrated in FIG. 1A. Structure 10 includes a semiconductor substrate 12 that has at least one gate region 16 which is located on a surface of the semiconductor substrate 12. Each gate region, i.e., 16, includes a gate dielectric 18, a polySi conductor 20, a dielectric cap 22, spacer 24 and source/drain regions 14. The source/drain regions 14 are located within the semiconductor substrate 12. The one gate region is provided for illustrative purposes and thus the present invention is not limited to only a single gate region. Instead, the present invention works when the substrate includes a plurality of gate regions.

The semiconductor substrate 12 of structure 10 comprises any semiconducting material including, but not limited to: Si, Ge, SiGe, SiC, SiGeC, Ga, GaAs, InAs, InP and all other III/V compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. For clarity, the doped regions are not specifically labeled in the drawings of the present application. The first doped region and the second doped region may be the same, or they may have different conductivities and/or doping concentrations. These doped regions are known as "wells".

Trench isolation regions 15 are typically already formed in the semiconductor substrate 12 at this point of the present invention utilizing conventional processes well known to those skilled in the art. The trench isolation regions 15 are typically formed utilizing trench isolation techniques that are well known in the art including, for example, forming a patterned mask on the surface of the substrate via lithography, etching a trench into the substrate thru an opening in the patterned mask, filling the trench with a trench dielectric such as $SiO_2$ or TEOS and planarizing the structure. An optional trench liner can be formed within the trench prior to trench dielectric fill and an optional densification step may follow the planarization process.

A gate dielectric 18 is formed on the entire surface of the structure 10 including the semiconductor substrate 12 and atop the isolation region 15, if it is present and, if it is a deposited dielectric. The gate dielectric 18 can be formed by a thermal growing process such as, for example, oxidation, nitridation or oxynitridation. Alternatively, the gate dielectric 18 can be formed by a deposition process such as, for example, chemical vapor deposition (CVD), plasma-assisted CVD, atomic layer deposition (ALD), evaporation, reactive sputtering, chemical solution deposition or other like deposition processes. The gate dielectric 18 may also be formed utilizing any combination of the above processes.

The gate dielectric 18 is comprised of an insulating material including, but not limited to: an oxide, nitride, oxynitride and/or silicate including metal silicates and nitrided metal silicates. In one embodiment, it is preferred that the gate dielectric 18 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 18 may vary, but typically, the gate dielectric 18 has a thickness from about 0.5 to about 10 nm, with a thickness from about 0.5 to about 3 nm being more typical.

After forming the gate dielectric 18, a blanket layer of polysilicon (i.e., polySi) which becomes the polySi gate conductor 20 shown in FIG. 1A is formed on the gate dielectric 18 utilizing a known deposition process such as, for example, physical vapor deposition, CVD or evaporation. The blanket layer of polysilicon may be doped or undoped. If doped, an in-situ doping deposition process may be employed in forming the same. Alternatively, a doped polySi layer can be formed by deposition, ion implantation and annealing. The doping of the polySi layer will shift the workfunction of the silicided metal gate formed. Illustrative examples of dopant ions include As, P, B, Sb, Bi, In, Al, Ga, Tl or mixtures thereof. Typical doses for the ion implants are 1E14 ($=1\times10^{14}$) to 1E16 ($=1\times10^{16}$) atoms/cm$^2$ or more typically 1E15 to 5E15 atoms/cm$^2$. The thickness, i.e., height, of the polysilicon layer deposited at this point of the present invention may vary depending on the deposition process employed. Typically, the polysilicon layer has a vertical thickness from about 20 to about 180 nm, with a thickness from about 40 to about 150 nm being more typical.

Although specific description is provided for polysilicon gate conductors, the present invention is not limited to only that type of gate material. Instead, other types of gate conductor materials such as metal or metal alloy gates, silicide gates, conductive nitride gates, polySiGe and combinations thereof, including combinations with polysilicon, are also contemplated herein. In embodiments in which the gate conductor is not comprised of polysilicon or polySiGe, a NiSi, PtSi contact in accordance with the present invention is not formed on top of the gate region. In such cases, the dielectric cap 22 (to be subsequently defined) typically, but not always, remains on the gate conductor during the salicidation process.

After deposition of the blanket layer of polysilicon, a dielectric cap 22 is typically formed atop the blanket layer of polysilicon gate conductor 20 utilizing a deposition process such as, for example, physical vapor deposition or chemical vapor deposition. The dielectric cap 22 may be an oxide, nitride, oxynitride or any combination thereof. The dielectric cap 22 can be comprised of a different dielectric material than spacer 24 to be defined in detail herein below. In one embodiment, a nitride such as, for example, $Si_3N_4$, is employed as the dielectric cap 22. In yet another embodiment, which is preferred, the dielectric cap 22 is an oxide such as $SiO_2$. The thickness, i.e., height, of the dielectric cap 22 is from about 20 to about 180 nm, with a thickness from about 30 to about 140 nm being more typical.

The blanket polysilicon layer and dielectric cap layer are then patterned by lithography and etching so as to provide patterned gate stacks. The patterned gate stacks may have the same dimension, i.e., length, or they can have variable dimensions to improve device performance. Each patterned gate stack at this point of the present invention includes a polySi gate conductor 20 and dielectric cap 22. The lithography step includes applying a photoresist to the upper surface of the dielectric cap layer, exposing the photoresist to a desired pattern of radiation and developing the exposed photoresist utilizing a conventional resist developer. The pattern in the photoresist is then transferred to the dielectric cap layer and the blanket layer of polysilicon utilizing one or more dry etching steps. In some embodiments, the patterned photoresist may be removed after the pattern has been transferred into the dielectric cap layer. In other embodiments, the patterned photoresist is removed after etching has been completed.

Suitable dry etching processes that can be used in the present invention in forming the patterned gate stacks include, but are not limited to reactive ion etching, ion beam etching, plasma etching or laser ablation. The dry etching process employed is typically selective to the underlying gate dielectric 18 therefore this etching step does not typically remove the gate dielectric. In some embodiments, this etching step may however be used to remove portions of the gate dielectric 18 that are not protected by the gate stacks. A wet etching process can also be used to remove portions of the gate dielectric 18 that are not protected by the gate stacks.

At least one spacer 24 is formed on exposed sidewalls of each patterned gate stack. The at least one spacer 24 is comprised of an insulator such as an oxide, nitride, oxynitride and/or any combination thereof and it typically is composed of a different material than the dielectric cap 22. Preferably, nitride spacers are formed. The at least one spacer 24 is formed by deposition and etching.

The width of the at least one spacer 24 must be sufficiently wide enough such that the source and drain silicide contacts (to be subsequently formed) do not encroach underneath the edges of the gate stack. Typically, the source/drain silicide does not encroach underneath the edges of the gate stack when the at least one spacer has a width, as measured at the bottom, from about 15 to about 80 nm.

After spacer formation, source/drain diffusion regions 14 are formed into the substrate 12. The source/drain diffusion regions 14 are formed utilizing ion implantation and an annealing step. The annealing step serves to activate the dopants that were implanted by the previous implant step. The conditions for the ion implantation and annealing are well known to those skilled in the art. In the present invention, the phrase "source/drain diffusion regions" includes extension regions, halo regions and deep source/drain regions.

In some embodiments of the present invention and when the substrate does not include silicon, a Si-containing layer can be formed atop of the exposed portions of the substrate to provide a source for forming the silicide contacts. Illustrative examples of Si-containing materials that can be used include, for example, Si, single crystal Si, polycrystalline Si, SiGe, and amorphous Si. This embodiment of the present invention is not illustrated in the drawings.

Figure 1B:
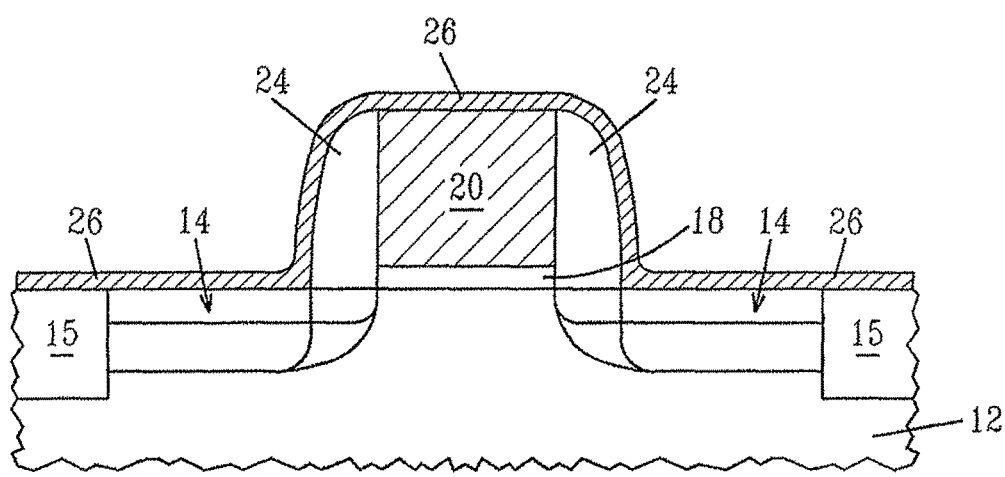

At this point of the present invention, the dielectric cap 22 atop the polysilicon gate conductor 20 is removed utilizing a conventional wet etching process that selectively removes the dielectric cap as compared to polysilicon. A blanket layer 26 of Ni with Pt (hereinafter NiPt alloy) is then formed uniformly over the entire structure 10 providing the structure shown, for example, in FIG. 1B. The blanket layer 26 of NiPt alloy is formed using a conventional deposition technique including, but not limited to: chemical vapor deposition (CVD), plasma-assisted CVD, high-density chemical vapor deposition (HDCVD), plating, sputtering, evaporation and chemical solution deposition. The deposition of the blanket layer 26 of NiPt alloy is continued until an initial thickness of about 25 nm or less, preferably about 15 nm or less, even more preferably about 10 nm or less, is produced.

In some embodiments, a Ni layer can be first deposited and then it can be doped with Pt to provide the NiPt alloy layer. Ion implantation or gas phase doping can be used when this embodiment of the present invention is employed.

In accordance with the present invention, the blanket layer 26 of NiPt alloy comprises from about 80 to about 95 atomic percent Ni. More typically, Ni is present in the alloy in an amount from about 90 to about 95 atomic percent. The remainder is Pt and, if present, another metal.

The other metal or alloying additive that can be optionally present in the NiPt alloy layer comprises at least one of Pd, Rh, Ti, V, Cr, Zr, Nb, Mo, Ht, Ta, W or Re. In one embodiment of the present invention, the other alloying additive is Re. When present, the alloying additive is present in an amount from about 0 to about 50 atomic %, with an amount from about 0.1 to about 20 atomic % being more typical. More typically, the other metal is present in an amount from about 0.5 to about 10 atomic %.

Figure 1C:
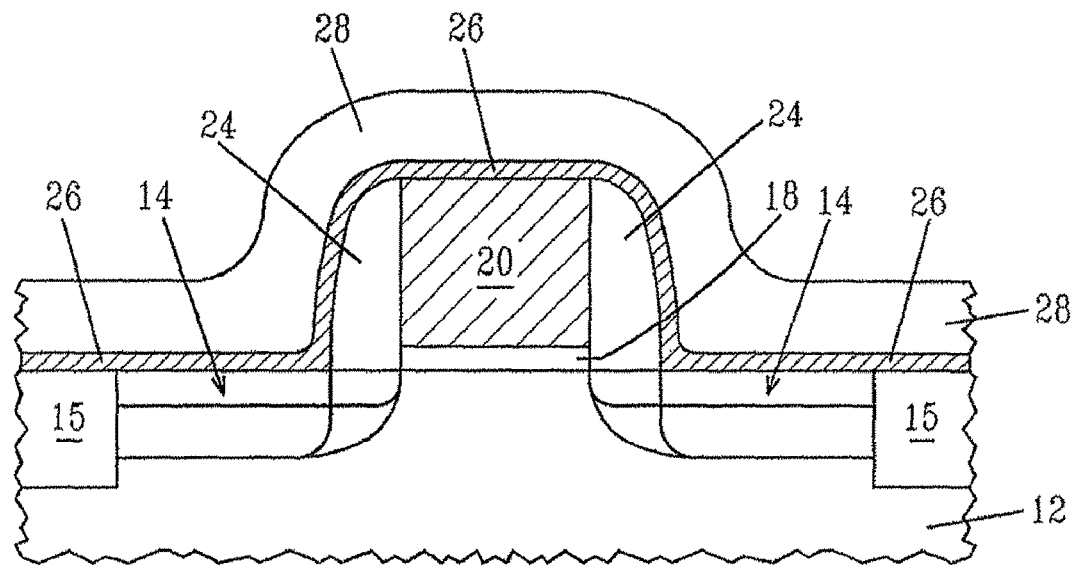

An oxygen diffusion barrier 28 is then formed atop the blanket layer 26 of NiPt alloy to provide the structure shown, for example, in FIG. 1C. The oxygen diffusion barrier 28 includes any material that can prevent oxidation of the blanket layer 26 of NiPt alloy. Illustrative examples of such materials that can be used as the oxygen diffusion barrier 28 include, for example, Ti, TiN, W, WN, Ta, or TaN. The oxygen diffusion barrier 28 can be formed utilizing a conventional deposition process including those mentioned above in forming the blanket layer 26.

Figure 1D:
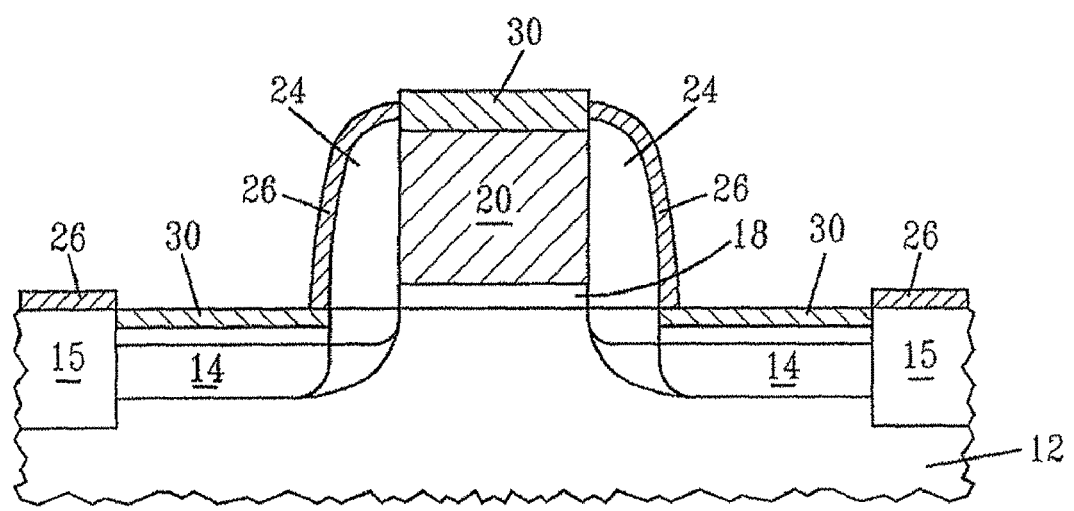
Figure 1E:
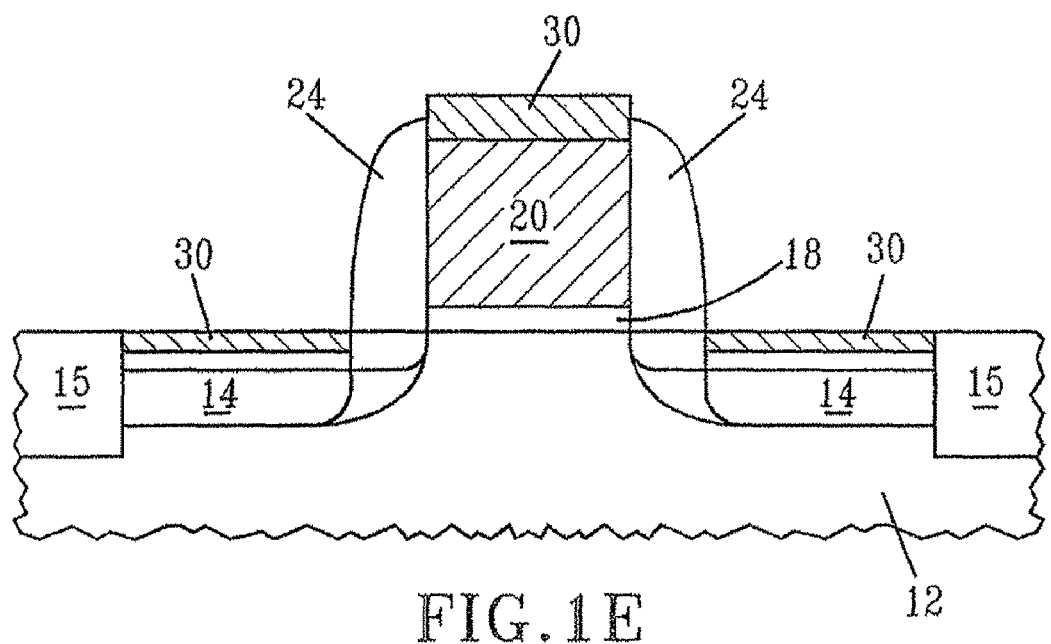

FIG. 1D shows the structure that is formed after heating, while FIG. 1E shows the structure after etching. In the illustrated structure shown in FIGS. 1D and 1E, reference numeral 30 denotes the NiSi, PtSi silicide contact (NiPt silicide contact). Unlike conventional salicide processes, the applicants have determined the optimal conditions for forming a low resistivity NiSi, PtSi silicide contact 30 in regions in which the NiPt alloy is in contact with silicon. The optional conditions include raising the temperature of the structure from ambient (20° C.) to a temperature within the range from about 300° C. to about 550° C. at a ramp rate from about 1° C./sec to about 35° C./sec, holding at this temperature range for a time period from about 1 to about 60 seconds in an atmosphere that includes an inert gas such as He, Ne, Ar, Xe, Kr N$_2$ or mixtures thereof with less than 1 ppm oxygen, and lowering the temperature after this soak cycle below 100° C. within a time period from about 10 to about 600 seconds. The initial ramp up and cool down can be performed in the same or different inert ambient as the hold cycle. More preferably, the heating step comprises an initial ramp up from ambient (20° C.) to a temperature within the range from about 360° C. to about 450° C. at a ramp rate from about 5° C./sec to about 12° C./sec, holding at this temperature range for a time period from about 1 to about 10 seconds, and lowering the temperature after this soak cycle below 100° C. within a time period from about 10 to about 200 seconds.

Note that during the heating step, the oxygen diffusion barrier 28 can be consumed. In other embodiments, the oxygen diffusion barrier 28 is removed during the subsequent etching step.

Despite describing the use of the foregoing single heating step, the present invention also contemplates a second heating step that is performed at temperatures within the range mentioned above, i.e., from about 300° C. to about 550° C. The second heating step is typically performed at a temperature from about 400° C. to about 475° C. The optional second heating step is performed in the same or different inert ambient as that of the first heating step.

The NiSi, PtSi silicide contact 30 formed after the heating step typically has a thickness from about 10 to about 50 nm, with a thickness from about 15 to about 25 nm being even more typical. The NiSi, PtSi silicide contact 30 has a low sheet resistance that is on the order of about 30 ohm/square or less. The presence of the alloy additives such as Re can lower the sheet resistivity below the value of a NiSi, PtSi alloy.

After heating, unreacted metal from the NiPt alloy is removed utilizing an etching process that is selective to NiSi, PtSi as well as dielectrics such as Si$_3$N$_4$ and SiO$_2$, substrate material and polySi. Specifically the unreacted metal located on the spacers and the trench isolation regions is removed during this etching step of the present invention. Hence, the etching step provides a structure such as shown in FIG. 1E in which no stringers of Pt are located on the spacers or the trench isolation regions.

The etching step of the present invention does not use the typical etchant solution employed in normal salidication process to remove unreacted metal. That is, the conventional etchant solution comprising a mixture of hydrogen peroxide and sulfuric acid is not used. Instead, the inventive etchant solution used to selectively etch the unreacted NiPt alloy from the structure, particularly from the spacers and the trench isolation regions, comprises an oxidizing agent, a complexing agent and a solvent.

The oxidizing agent comprises any material that is capable of oxidizing Pt such that a Pt$^{4+}$ species is formed. Illustrative examples of suitable oxidizing agents that can be present in the inventive etchant solution comprise nitric acid, hydrogen peroxide, potassium permanganate, persulfate (sodium, ammonia or potassium), ceric ammonium nitrate or potassium monopersulfate. In one embodiment of the present invention, the oxidizing agent present in the etchant solution is nitric acid.

The complexing agent employed in the present invention is any material that is capable of forming a complex with the Pt$^{4+}$ species formed by the oxidizing agent. The complexing agents include, for example, one of chloride, iodide, or bromide. Illustrative examples of complexing agents include, but are not limited to: Acids and sodium, potassium and calcium salts of anions such as chloride, bromide, iodide (e.g., hydrochloric acid, sodium iodide, potassium iodide, sodium bromide, or potassium bromide). In one embodiment of the present invention, the complexing agent is hydrochloric acid.

The solvent of the etchant solution comprises any substance that is capable of dissolving Ni and the complexed $Pt^{4+}$ species. The solvent can be a polar solvent such as water or a nonpolar solvent such as a hydrocarbon. Water is a preferred solvent used in the inventive etching solution.

The molar ratio of oxidizing agent:complexing agent:solvent is from about 1:10:200 to about 1:1:5, with a molar ratio of oxidizing agent:complexing agent:solvent from about 1:5:45 to about 1:3:10 being more typical.

The etching is performed by first providing a bath containing the etchant solution described above, heating that solution to a temperature from about 30° C. to about 80° C. and holding that temperature for at least 15 minutes. Preferably, the bath temperature is from about 35+ C. to about 45+ C. and holding time is at least 30 minutes. The bath is recirculated by pumping solution at 10 to 30 gallons/minute. Other pumping rates are also contemplated herein.

Figure 2:
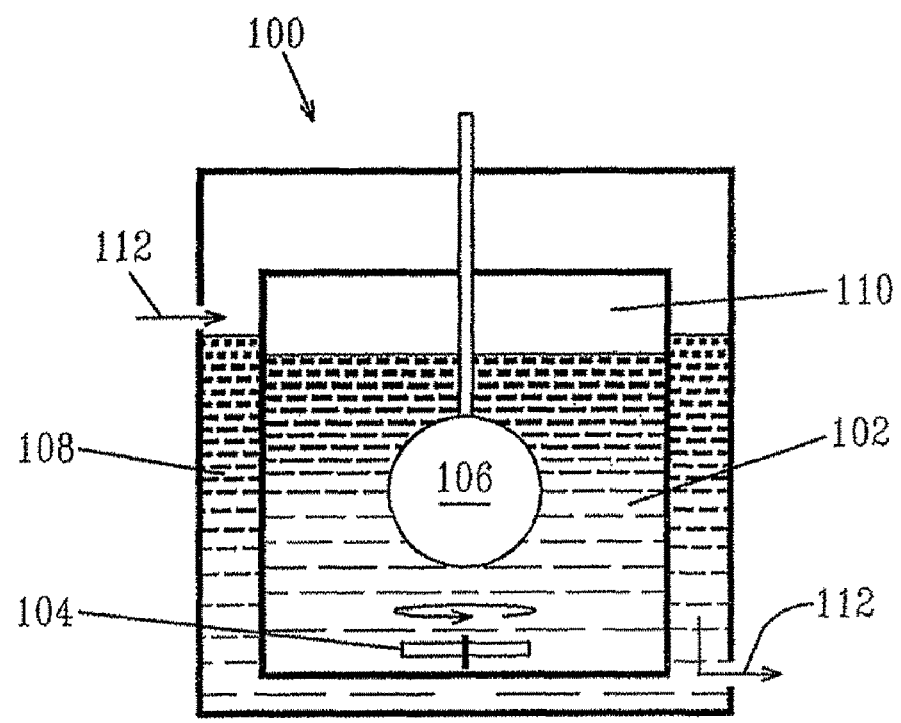
FIG. 2 is a schematic of one possible setup for etching wafers.

FIG. 2 shows one possible etching apparatus 100 that can be used in the present invention. The apparatus 100 includes the etching solution described above 102, a workpiece (such as shown in FIG. 1C) 104 for etching that includes at least a NiPt alloy that needs to be selectively removed therefrom, a water bath 108 and a mechanical stirring means 106. The etching solution 102, the workpiece 104 and the mechanical stirring means 106 are located with a reactor chamber 110, and the water bath 108 surrounds the reactor chamber 110. It is noted that the schematic shown in FIG. 2 represents one possible etching apparatus that can be used in the present invention.

After recirculating the bath (shown by arrow 112), the workpiece is immersed in the bath and the bath temperature is maintained within the range from about 30° C. to about 80° C. This step typically is performed for a time period from about 10 to about 45 minutes. More typically, the bath containing the immersed workpiece is held at temperature from about 35° C. to about 45° C. and etching occurs for a time period from about 30 to about 45 minutes.

After etching, the workpiece is removed from the bath and rinsed with deionized water so as to remove traces of the bath from the workpiece. After rinsing, the workpiece is dried utilizing conventional drying techniques well known in the art including, for example, air drying, vacuum drying or oven drying.

In addition to immersing the workpiece into the bath containing the above described etching solution, the etching step of the present invention also contemplates other contacting means. For example, the bath containing the etchant solution described above can applied to the workpiece requiring etching of NiPt alloy by (a) spraying the solution on top of the workpiece, (b) holding the workpiece and flowing the solution on top of it, or (c) holding the workpiece and squirting or brushing the solution on top of the workpiece (either the oxidizer, solvent and complexant can be mixed right on top of the workpiece or the etchant solution can be premixed and squirted or brushed on top of the workpiece).

After etching, conventional middle-of-line (MOL) and back-end-of-the-line (BEOL) processing steps can be employed so as to form metal contacts to the NiSi, PtSi contacts 30 formed above. For example, a blanket dielectric layer can be formed atop the structure shown in FIG. 1D and thereafter an opening that extends to the silicide contact that is located atop both the source/drain regions and the gate region can be formed via lithography and etching. A conductive metal is then deposited into the opening and thereafter a planarization process such as chemical mechanical polishing may be employed.

The following examples are provided to illustrate some of the problems in the prior art as well as to demonstrate the advantages of the present invention.

Example 1

This example illustrates the problem with using the prior art etching solution (mixture of hydrogen peroxide and sulfuric acid) which leaves stringers of Pt on the spacers and the trench isolation regions. Reference is made first to FIG. 3 which is a top-down SEM image of SRAM cell with Ni—Pt silicide contact which was prepared using the processing steps described above except that the etching solution was a conventional solution of hydrogen peroxide and sulfuric acid. Incomplete removal of metals was seen with this etch (Hydrogen peroxide, sulfuric acid mixture). AES analysis of stringers (unreacted metal) reveals that they were platinum.

FIG. 4 is a cross-section image of an NFET with Ni—Pt silicide contact prepared using the above processing steps except that the conventional etch solution described above was employed. Presence of unreacted metal on the spacer was seen after this etch which could lead to shorting of the device between the gate and the source/drain regions.

Example 2

This example illustrates the importance of utilizing the processing steps of the present invention. Specifically, FIG. 5 illustrates the change in sheet resistance of NiPt Alloy samples with different anneal temperatures. In this instance, samples were annealed in an inert (nitrogen) atmosphere with less than 1 ppm oxygen to prevent oxidation of metals, The temperature of the blanket layer was raised from ambient temperature to 150°-500° C. at a ramp rate of 5° C./s. Each sample was held at the desired temperature for 5 seconds and subsequently brought back to room temperature. The sheet resistance for both NiPt and NiPtRe wafers remained high at temperatures less than 350° C. and decreases dramatically beyond 350° C. The high $R_s$ corresponds with metal rich phases such as $Ni_2Si$, $Ni_3Si$, $Ni_{31}Si_{12}$. The change in $R_s$ can be directly correlated to the formation of the monosilicide phase. The transition from metal rich phases to NiSi is sharper in NiPtRe as compared to NiPt. Further, the transition temperature is significantly influenced by the substrate (SOI, PolySi) and dopant (As, B). To prevent the etchant from attacking the contact, it is essential that all metal rich phases are completely converted to the monosilicide.

Tables 1 and 2 present etch rates of Ni and Pt, respectively, in mixtures of hydrochloric and nitric acids. The etch rate of Ni increases exponentially with increase in acid concentration. Pt is a noble metal and cannot be removed easily. Both hydrochloric acid and nitric acid individually are not capable of removing platinum. Nitric acid is a strong oxidizer and will oxidize Pt to $Pt^{4+}$. Hydrochloric acid will complex with $Pt^{4+}$ as hexachloroplatinic acid ($H_2PtCl_6$). Hence, a mixture of these acids can dissolve platinum.

FIG. 6 is a cross-section of an NFET with Ni alloy silicide contacts. The wafer was annealed at 300° C. and subsequently etched in a mixture of hydrochloric and nitric acid. Incomplete silicide formation leads to attack and removal of metal rich phase. Hence, anneal temperature should be optimized to achieve complete silicidation.

Table 3 presents sheet resistance of n and p doped Ni alloy silicide before and after immersion in etchant. Sheet resistance does not change after etch indicating absence of attack on the silicide.

TABLE 1

Etch Rates of Ni

| Molar ratio of HNO$_3$:HCl:Water | Sample | Temperature (° C.) | Etch Rate (Å/min) |
|---|---|---|---|
| 1:4:15 | Ni | 40 | — |
| 1:4:22 | Ni | 40 | 4100 |
| 1:4:29 | Ni | 40 | 986 |
| 1:4:36 | Ni | 40 | 512 |
| 1:4:47 | Ni | 40 | 235 |
| 1:4:65 | Ni | 40 | 158 |

TABLE 2

Etch Rates of Pt

| Molar ratio of HNO$_3$:HCl:Water | Sample | Temperature (° C.) | Etch Rate (Å/min) |
|---|---|---|---|
| 1:4:15 | Pt | 40 | 193 |
| 1:4:22 | Pt | 40 | 76 |
| 1:4:29 | Pt | 40 | 84 |
| 1:4:36 | Pt | 40 | 46.5 |
| 1:4:47 | Pt | 40 | 4.5 |
| 1:4:65 | Pt | 40 | 2.2 |

TABLE 3

Sheet Resistance of n and p doped Ni alloy silicide before and after immersion in the etchant solution

| Doping | Molar ratio of HNO$_3$:HCl:Water | Etch Time (minutes) | Bath Temperature (° C.) | Sheet Resistance (Ohm/Sq.) |
|---|---|---|---|---|
| N-doped | | As received | | 8.618 |
| N-doped | 1:4:36 | 20 | 40 | 8.594 |
| N-doped | 1:4:29 | 20 | 40 | 8.535 |
| N-doped | 1:4:29 | 20 | 50 | 8.485 |
| P-doped | | As received | | $8.3275 \times 10^{-2}$ |
| P-doped | 1:4:36 | 20 | 40 | $8.2600 \times 10^{-2}$ |
| P-doped | 1:4:29 | 20 | 40 | $8.361 \times 10^{-2}$ |
| P-doped | 1:4:29 | 20 | 50 | $8.36 \times 10^{-2}$ |

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a self-aligned metal contact comprising the steps of:
   depositing a blanket layer of Ni with Pt on a surface of a structure including at least one gate region, wherein said Ni is present in a concentration from about 80 to about 95 atomic percent;
   forming an oxygen diffusion barrier layer on a surface of the blanket layer;
   heating the structure including the blanket layer to a temperature from about 300° C. to about 550° C. by raising the temperature from an ambient temperature at a ramp rate from about 1° C./sec to about 35° C./sec, holding the temperature for about 1 to about 60 seconds in an inert atmosphere containing less than about 1 ppm oxygen, and lowering the temperature below 100° C. within a time period from about 10 to about 600 seconds thereby forming a NiSi, PtSi contact on portions of the structure comprising silicon; and
   etching the structure after heating, said etching removes unreacted NiPt selective to the contact and comprises providing a bath comprising an oxidizing agent, a complexing agent and a solvent; holding the bath at a temperature in a range from about 30° C. to about 80° C. for at least 15 minutes; contacting the structure with said bath; holding said bath at a temperature in a range from about 30° C. to about 80° C. for about 10 to about 45 minutes; removing said structure from said bath; and rinsing said structure to remove traces of said bath from said structure and drying the same.

2. The method of claim 1 wherein said blanket layer of Ni with Pt is formed by depositing a mixture containing Ni and Pt or by first depositing a Ni layer and then incorporating Pt therein.

3. The method of claim 2 wherein said Pt is incorporated by gas phase doping or ion implantation.

4. The method of claim 1 wherein said blanket layer of Ni with Pt further comprises another metal selected from the group consisting of Pd, Rh, Ti, V, Cr, Zr, Nb, Mo, Hf, Ta, W, Re and combinations thereof.

5. The method of claim 4 wherein said another metal is Re.

6. The method of claim 1 wherein said blanket layer comprises from about 90 to about 95 atomic % Ni.

7. The method of claim 4 wherein said another metal is present in an amount up to about 50 atomic %.

8. The method of claim 7 wherein said another metal is present in an amount from about 0.1 to about 20 atomic %.

9. The method of claim 1 wherein said at least one gate region comprises a gate dielectric, a gate conductor and a spacer located on sidewalls of at least the gate conductor.

10. The method of claim 1 wherein said at least one gate region is formed atop a semiconductor substrate which includes trench isolation regions.

11. The method of claim 10 wherein said semiconductor substrate is a Si-containing material.

12. The method of claim 1 wherein said at least one gate region comprises a polySi gate conductor.

13. The method of claim 1 wherein said at least one gate region is an NFET or a PFET.

14. The method of claim 1 wherein said oxygen diffusion barrier layer comprises one of Ti, TiN, W, WN, Ta or TaN.

15. The method of claim 1 wherein said raising is performed to a temperature from about 300° C. to about 550° C. at a ramp rate from about 1° C./sec to about 35° C./sec.

16. The method of claim 1 wherein said holding is performed for a time period from about 1 to about 60 seconds.

17. The method of claim 1 wherein said lowering the temperature is performed at a temperature below 100° C. within a time period from about 10 to about 600 seconds.

18. The method of claim 1 wherein said holding temperature is from about 35° C. to about 45° C. and said holding time is at least 30 minutes.

19. The method of claim 1 wherein oxidizing agent, said complexing agent and said solvent are present in a molar ratio from about 1:10:200 to about 1:1:5.

20. The method of claim 1 wherein said oxidizing agent comprises nitric acid, hydrogen peroxide, potassium permanganate, persulfate (sodium, ammonia or potassium), eerie ammonium nitrate or potassium monopersulfate.

21. The method of claim 20 wherein said oxidizing agent is nitric acid.

22. The method of claim 1 wherein said complexing agent is chloride ion supplied as sodium chloride and hydrochloric acid, sodium iodide, potassium iodide, sodium bromide or potassium bromide.

23. The method of claim 22 wherein said complexing agent is hydrochloric acid.

24. The method of claim 1 wherein said solvent is a polar solvent or a nonpolar solvent.

25. The method of claim 1 wherein said solvent is water.

26. The method of claim 1 wherein said oxidizing agent is nitric acid, said complexing agent is hydrochloric acid and said solvent is water.

27. The method of claim 1 wherein said holding said bath is performed at a temperature from about 35° C. to about 45° C. and said time is from about 15 to about 45 minutes.

* * * * *